United States Patent
Yoo et al.

(10) Patent No.: US 11,387,270 B2
(45) Date of Patent: Jul. 12, 2022

(54) IMAGE SENSOR PACKAGE INCLUDING REFLECTOR

(71) Applicant: Samsung Electro-Mechanics Co., Ltd., Suwon-si (KR)

(72) Inventors: Do Jae Yoo, Suwon-si (KR); Byoung Heon Kim, Suwon-si (KR); Yong Gil Namgung, Suwon-si (KR); Jong Cheol Hong, Suwon-si (KR); Si Joong Yang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 187 days.

(21) Appl. No.: 16/535,123

(22) Filed: Aug. 8, 2019

(65) Prior Publication Data

US 2020/0350351 A1    Nov. 5, 2020

(30) Foreign Application Priority Data

May 2, 2019    (KR) .......................... 10-2019-0051574

(51) Int. Cl.
*H01L 27/146*    (2006.01)
*H01L 23/00*    (2006.01)

(52) U.S. Cl.
CPC ........ *H01L 27/14618* (2013.01); *H01L 24/05* (2013.01); *H01L 24/48* (2013.01); *H01L 24/85* (2013.01); *H01L 27/14625* (2013.01); *H01L 27/14629* (2013.01); *H01L 27/14634* (2013.01); *H01L 27/14636* (2013.01); *H01L 27/14685* (2013.01); *H01L 2224/04042* (2013.01);

(Continued)

(58) Field of Classification Search
CPC ......... H01L 24/05; H01L 24/48; H01L 24/85; H01L 27/14618; H01L 27/14625; H01L 27/14629; H01L 27/14634; H01L 27/14636; H01L 27/14685; H01L 2224/04042; H01L 2224/48091; H01L 2224/48106; H01L 2224/48227

USPC ......................................... 257/432
See application file for complete search history.

(56) References Cited

U.S. PATENT DOCUMENTS 9,781,323 B1    10/2017    Wang et al.
9,781,324 B2    10/2017    Wang et al.
9,781,325 B1    10/2017    Wang et al.
(Continued)

FOREIGN PATENT DOCUMENTS

CN    207304699 U    5/2018
CN    207465745 U    6/2018
(Continued)

OTHER PUBLICATIONS

Korean Office Action dated Sep. 16, 2020 in counterpart Korean Patent Application No. 10-2019-0051574 (8 pages in English and 6 pages in Korean).

*Primary Examiner* — Lex H Malsawma
*Assistant Examiner* — Eric W Jones
(74) *Attorney, Agent, or Firm* — NSIP Law

(57) ABSTRACT

An image sensor package includes a substrate, an image sensor mounted on the substrate, a bonding wire connecting the image sensor to the substrate, a reflector disposed on the image sensor, a sealing member sealing the bonding wire and a portion of the image sensor, and covering at least a portion of the reflector, the sealing member including a hole exposing an effective imaging plane of the image sensor, and a filter attached to the sealing member.

22 Claims, 5 Drawing Sheets

(52) U.S. Cl.
CPC ............... *H01L 2224/48091* (2013.01); *H01L 2224/48106* (2013.01); *H01L 2224/48227* (2013.01)

(56) References Cited

U.S. PATENT DOCUMENTS

| | | |
|---|---|---|
| 9,826,132 B2 | 11/2017 | Wang et al. |
| 9,848,109 B2 | 12/2017 | Wang et al. |
| 9,876,948 B2 | 1/2018 | Wang et al. |
| 9,876,949 B2 | 1/2018 | Wang et al. |
| 9,894,772 B2 | 2/2018 | Wang et al. |
| 9,900,487 B2 | 2/2018 | Wang et al. |
| 9,906,700 B2 | 2/2018 | Wang et al. |
| 9,998,644 B1 | 6/2018 | Wang et al. |
| 2005/0237418 A1* | 10/2005 | Sakamoto ......... H01L 27/14618 348/340 |
| 2009/0051052 A1* | 2/2009 | Yoshioka ............ H01L 23/3185 257/788 |
| 2013/0193545 A1 | 8/2013 | Jeong et al. |
| 2017/0264801 A1* | 9/2017 | Wang .................... H04N 5/2258 |
| 2017/0280027 A1* | 9/2017 | Wang ................ H01L 27/14618 |
| 2019/0103919 A1* | 4/2019 | Hailai .................. G02B 6/4215 |
| 2019/0259688 A1* | 8/2019 | Scharf ................ H01L 23/3135 |
| 2019/0393362 A1* | 12/2019 | Chen ........................ H01L 31/18 |

FOREIGN PATENT DOCUMENTS

| | | |
|---|---|---|
| JP | 2003-332542 A | 11/2003 |
| JP | 2006-33254 A | 2/2006 |
| JP | 2006-237051 A | 9/2006 |
| JP | 2010-123671 A | 6/2010 |
| JP | 2012-28620 A | 2/2012 |
| KR | 10-2011-0077416 A | 7/2011 |
| KR | 10-2013-0087249 A | 8/2013 |

* cited by examiner

IMAGE SENSOR PACKAGE INCLUDING REFLECTOR

CROSS-REFERENCE TO RELATED APPLICATION

This application claims the benefit under 35 USC 119(a) of Korean Patent Application No. 10-2019-0051574 filed on May 2, 2019, in the Korean Intellectual Property Office, the entire disclosure of which is incorporated herein by reference for all purposes.

BACKGROUND

1. Field

This application relates to an image sensor package.

2. Description of Related Art

In general, a camera module is included in various information technology devices such as portable electronic devices. Due to the trend for miniaturization of portable electronic devices in recent years, the miniaturization of a camera module itself is also required.

An infrared cut filter is disposed in the camera module to block light in the infrared region.

In general, an additional device is used to attach the infrared cut filter to a housing, or a structure capable of attaching the infrared cut filter to the housing is formed.

However, the device or structure for attaching the infrared cut filter limits the amount an overall height of a camera module can be reduced.

Recently, portable electronic devices such as smartphones have been decreasing in thickness. However, it is difficult to reduce a thickness of the smartphone if a height of a camera module included in the smartphone cannot be reduced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an image sensor package includes a substrate; an image sensor mounted on the substrate; a bonding wire connecting the image sensor to the substrate; a reflector disposed on the image sensor; a sealing member sealing the bonding wire and a portion of the image sensor, and covering at least a portion of the reflector, the sealing member including a hole exposing an effective imaging plane of the image sensor; and a filter attached to the sealing member.

The reflector may be disposed outside the effective imaging plane.

A portion of the reflector may be covered by the sealing member, and a remaining portion of the reflector may be exposed by the hole of the sealing member.

The sealing member may include an upper surface, and an inner side surface forming the hole, and the inner side surface may be rougher than the upper surface.

The sealing member may include an inner side surface forming the hole, and the inner side surface may include a stepped portion.

The stepped portion may cause a size of a portion of the hole adjacent to the image sensor to be larger than a size of a portion of the hole adjacent to the filter when the hole is viewed in a direction perpendicular to an upper surface of the image sensor.

The inner side surface of the sealing member may include a first surface extending from an upper surface of the sealing member to the stepped portion, and a second surface extending from the stepped portion to the reflector, and the first surface may protrude further toward a center of the hole than the second surface.

The sealing member may include an inner side surface forming the hole, and a portion of the inner side surface adjacent to the reflector may have a recessed shape.

In another general aspect, an image sensor package includes a substrate; an electronic component mounted on the substrate; an image sensor mounted on the substrate; a bonding wire connecting the image sensor to the substrate; a reflector disposed on the substrate; a sealing member sealing the electronic component, and covering at least a portion of the reflector, the sealing member including a hole exposing the image sensor; and a filter attached to the sealing member.

The sealing member may include an upper surface, and an inner side surface forming the hole, and the inner side surface may be rougher than the upper surface.

The sealing member may include an inner side surface forming the hole, and the inner side surface may include a stepped portion.

The sealing member may include an inner side surface forming the hole, and a portion of the inner side surface adjacent to the reflector may have a recessed shape.

The hole may further expose the bonding wire.

In another general aspect, an image sensor package includes a substrate; an electronic component mounted on the substrate; an image sensor mounted on the substrate; a bonding wire connecting the image sensor to the substrate; a reflector disposed on the image sensor or the substrate; a sealing member sealing the electronic component and covering only a portion of the reflector, the sealing member including a hole exposing an effective imaging plane of the image sensor and a portion of the reflector that is not covered by the sealing member; and a filter attached to the sealing member and covering the hole in the sealing member.

The image sensor may include a bonding pad to which the bonding wire is connected, the reflector may be disposed on the image sensor between the bonding pad and the effective imaging plane, and the sealing member may further seal the bonding pad, the bonding wire, and a portion of the image sensor.

The sealing member may include an inner side surface forming the hole, and the inner side surface may include a stepped portion causing a size of a portion of the hole adjacent to the image sensor to be larger than a size of a portion of the hole adjacent to the filter when the hole is viewed in a direction perpendicular to an upper surface of the image sensor.

The electronic component may be disposed between the bonding wire and an outer edge of the substrate.

The reflector may be disposed on the substrate between the electronic component and the bonding wire, and the hole may further expose the bonding wire.

The sealing member may include an inner side surface forming the hole, and the inner side surface may include a stepped portion causing a size of a portion of the hole adjacent to the image sensor to be larger than a size of a portion of the hole adjacent to the filter when the hole is viewed in a direction perpendicular to an upper surface of the image sensor.

The electronic component may be disposed between the reflector and an outer edge of the substrate.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
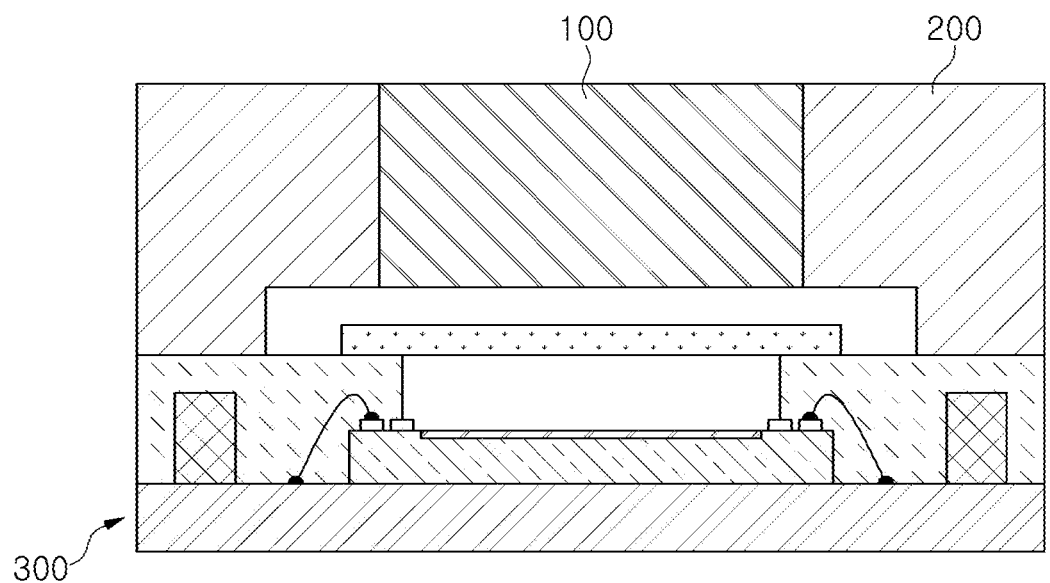
FIG. 1 is a schematic cross-sectional view of an example of a camera module.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

FIG. 1 is a schematic cross-sectional view of an example of a camera module.

Referring to FIG. 1, a camera module includes a lens portion 100, a housing 200, and an image sensor package 300.

The lens portion 100 includes a plurality of lenses (not shown) for imaging an object.

The housing 200 accommodates the lens portion 100, and may include an actuator (not shown) for moving the lens portion 100 in a direction of an optical axis of the lens portion 100 and/or a direction perpendicular to the optical axis lens portion 100.

The image sensor package 300 may be combined with a lower portion of the housing 200.

The image sensor package 300 is a device that converts light incident through the lens portion 100 into an electrical signal.

Figure 2:
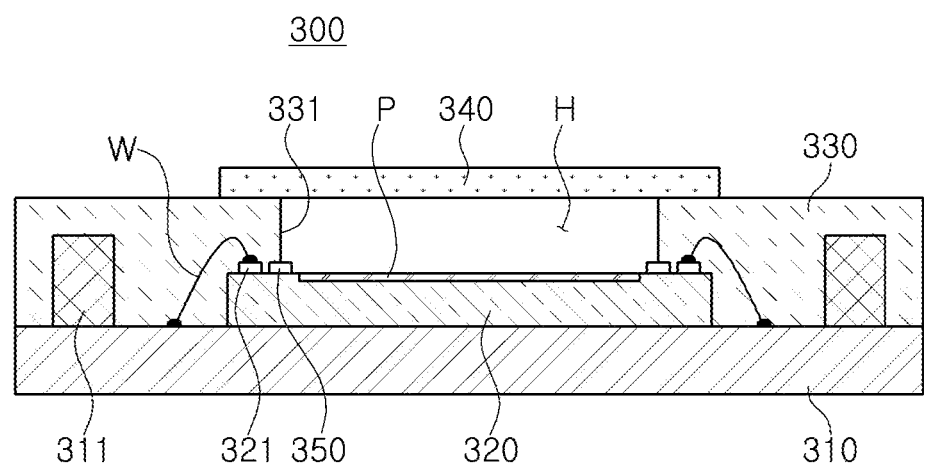
FIG. 2 is a schematic cross-sectional view of an example of an image sensor package.

FIG. 2 is a schematic cross-sectional view of an example of an image sensor package.

Referring to FIG. 2, an image sensor package 300 includes a substrate 310, an image sensor 320, a sealing member 330, and a filter 340.

The substrate 310 may be a printed circuit board.

The image sensor 320 converts light incident on the image sensor 320 through the lens portion 100 into an electrical signal. As an example, the image sensor 320 may be a charge-coupled device (CCD) or a complementary metal-oxide-semiconductor (CMOS) device.

An electrical signal converted by the image sensor 320 may be output as an image through a display unit of a portable electronic device.

The image sensor 320 is fixed to the substrate 310, and is electrically connected to the substrate 310 by a bonding wire W. An electronic component 311 is mounted on the substrate 310.

The image sensor 320 has an effective imaging plane P that receives light to form an image, and a bonding pad 321 and a reflector 350 are disposed on the image sensor 320 outside the effective imaging plane P. The bonding wire W is bonded to the bonding pad 321 to electrically connect the image sensor 320 to the substrate 310.

The reflector 350 is disposed between the bonding pad 321 and the effective imaging plane P, and at least a portion of the reflector 350 is covered by the sealing member 330, which will be described later.

The sealing member 330 is configured to cover the bonding wire W electrically connecting the image sensor 320 to the substrate 310.

The sealing member 330 covers and seals a portion of the image sensor 320, and covers and seals the bonding wire W and the electronic component 311.

The bonding pad 321 to which the bonding wire W is bonded is disposed outside the effective imaging plane P of the image sensor 320, and the sealing member 330 covers and seals the bonding wire W and the bonding pad 321.

Thus, the bonding wire W is protected by the sealing member 330. Accordingly, if an external impact is applied to the bonding wire W, a problem in which the bonding wire W is cut or broken can be prevented.

In addition, the sealing member 330 prevents debris from the bonding wire W from penetrating into the effective imaging plane P of the image sensor 320.

The sealing member 330 may have a color capable of absorbing light. The sealing member 330 may have a color having a low reflectance, for example, black.

Thus, extraneous light in the camera module may be prevented from being incident on the effective imaging plane P of the image sensor 320.

When extraneous light not needed for forming an image is incident on the effective imaging plane P, a flare phenomenon and other undesirable effects may occur. However, the sealing member 330 disposed around the effective imaging plane P of the image sensor 320 prevents extraneous light from being incident on the effective imaging plane P.

The sealing member 330 is made an epoxy material, and is formed using an injection molding process.

A hole H exposing the effective imaging plane P of the image sensor 320 is formed in the sealing member 330.

The filter 340 is an infrared cut filter that blocks light in the infrared region in the light incident through the lens portion 100. The filter 340 is attached to the sealing member 330. As an example, the filter 340 is attached to an upper surface of the sealing member 330 so that the filter 340 is spaced apart from the image sensor 320 by a predetermined interval.

In the related art, an additional device is used to attach the filter 340 to a housing 200, or a structure capable of attaching the filter 340 to the housing 200 is formed. However, the device or the structure for attaching the filter 340 limits the amount an overall height of a camera module can be reduced.

Recently, portable electronic devices such as smartphones have been decreasing in thickness. However, it is difficult to reduce a thickness of the smartphone if a height of a camera module included in the smartphone cannot be reduced.

However, since the filter 340 is attached to the sealing member 330 in the example of the image sensor package 300 illustrated in FIG. 2, an additional device or structure for attaching the filter 340 is not required. Thus, a height of the image sensor package 300 can be reduced, and accordingly a height of a camera module including the image sensor package 300 can be reduced.

FIGS. 3 to 9 are schematic cross-sectional views illustrating an example of a method of manufacturing an image sensor.

Figure 3:
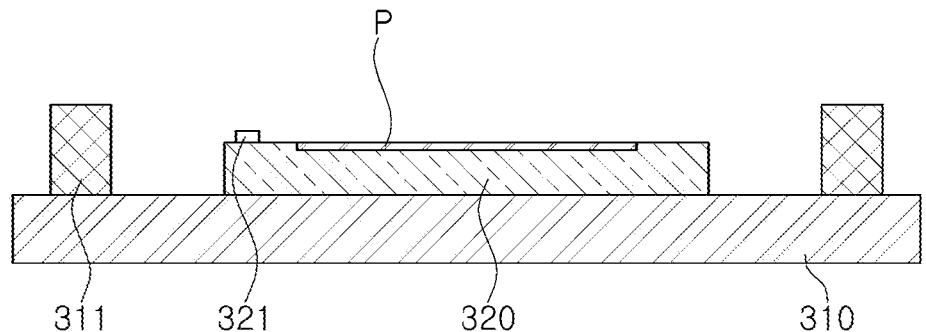
FIGS. 3 to 9 are schematic cross-sectional views illustrating an example of a method of manufacturing an image sensor package.

Referring to FIG. 3, an electronic component 311 and an image sensor 320 having a bonding pad 321 are mounted on a substrate 310.

Figure 4:
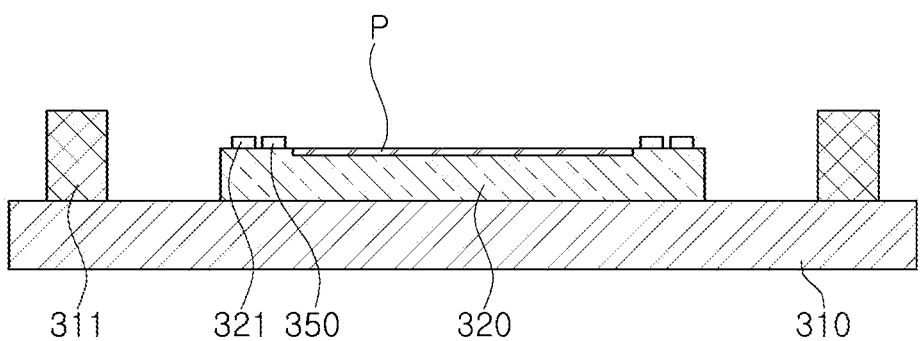

Referring to FIG. 4, a reflector 350 is formed on the image sensor 300 outside an effective imaging plane P of the image sensor 320. The reflector 350 may be formed so that the reflector 350 surrounds the periphery of the effective imaging plane P.

Figure 5:
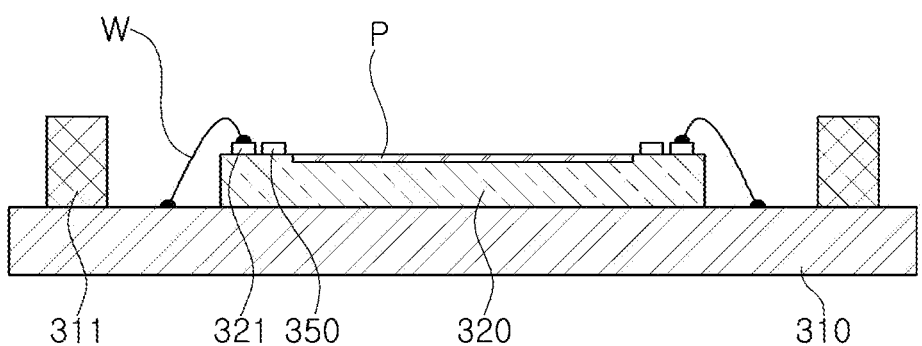

Referring to FIG. 5, the image sensor 320 is connected to the substrate 310 with a bonding wire W. One end of the bonding wire W is connected to the bonding pad 321 of the image sensor 320, and the other end of the bonding wire W is connected to the substrate 310.

FIGS. 4 and 5 show forming the reflector 350 on the image sensor 320 first, and then connecting the image sensor 320 to the substrate 310 with the bonding wire W. Alternatively, the image sensor 320 may be connected to the substrate 310 with the bonding wire W first, and then the reflector 350 may be formed on the image sensor 320.

Figure 6:
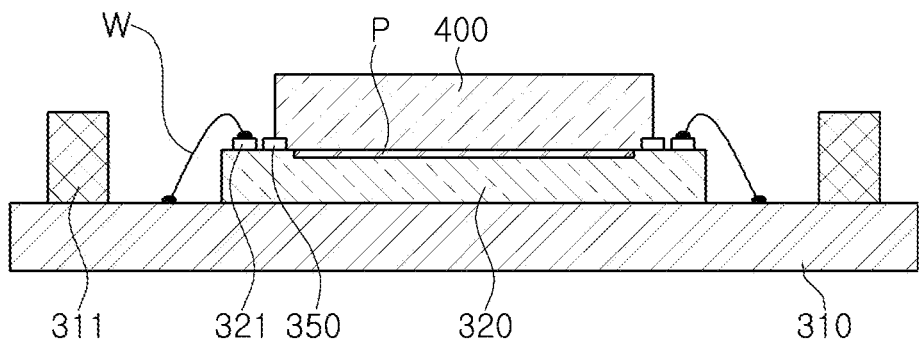

Referring to FIG. 6, a protective member 400 is attached to an upper surface of the image sensor 320. A size of the protective member 400 is larger than a size of the effective imaging plane P of the image sensor 320. Thus, the protective member 400 covers the effective imaging plane P of the image sensor 320.

The protective member 400 has a size big enough to cover a portion of the reflector 350 formed on the image sensor 320 outside the effective imaging plane P, but small enough so that the protective member 400 does not cover any portion of the bonding pad 321 disposed on the image sensor 320 outside the reflector 350.

The protective member 400 may be made of a flexible, adhesive material to protect the effective imaging plane P of the image sensor 320 in an injection molding process.

Figure 7:
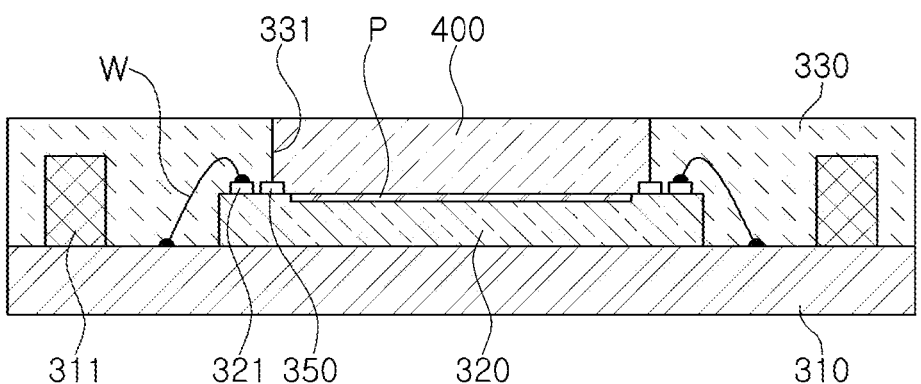

Referring to FIG. 7, a sealing member 330 is formed by an injection molding process.

The protective member 400 serves as a barrier to protect the effective imaging plane P of the image sensor 320 from being damaged by the injection molding process, while preventing a resin material used to form the sealing member 330 from flowing toward the effective imaging plane P.

An upper surface of the sealing member 330 is formed to be in substantially the same plane as an upper surface of the protective member 400. A height of the protective member 400 is set in consideration of a height of the sealing member 330, thereby enabling the sealing member 300 to be formed by the injection molding process without needing a mold having a complex shape. Accordingly, a manufacturing cost may be reduced.

The sealing member 330 covers and seals the electronic component 311, the bonding wire W, and a portion of the image sensor 320, and covers a portion of the reflector 350.

When a side surface of the protective member 400 is a vertical surface, an inner side surface 331 of the sealing member 330 in contact with the side surface of the protective member 400 is also a vertical surface.

Thus, the sealing member 330 is able to completely cover the bonding wire W, thereby providing stable sealing.

Figure 8:
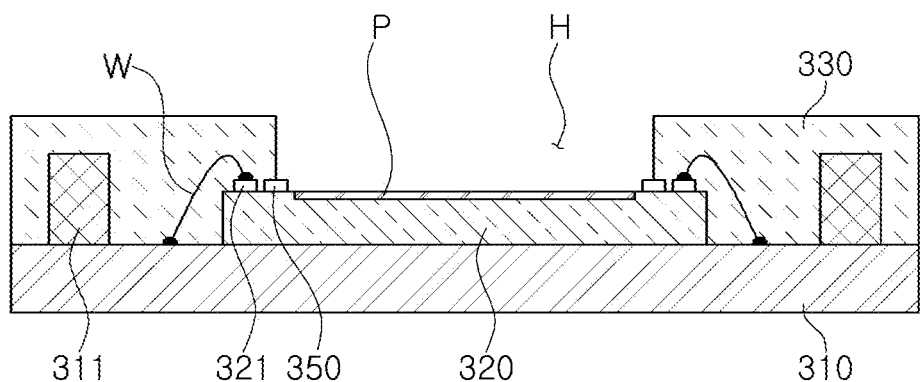

Referring to FIG. 8, the protective member 400 is removed. The protective member 400 is bonded to the sealing member 330 formed using the injection molding process, so the protective member 400 is separated from the sealing member 330 using a laser.

Also the protective member 400 is attached to the image sensor 320, so the protective member 400 is separated from the image sensor 320 using water, or by irradiating ultraviolet (UV) light or applying heat to the protective member 400, or by any of various other methods. Thus, the protective member 400 is removed.

When the protective member 400 is removed, the effective imaging plane P is exposed, and the sealing member 330 surrounds the periphery of the effective imaging plane P. That is, the sealing member 330 has a hole H exposing the effective imaging plane P.

A portion of the reflector 350 is covered by the sealing member 330, and a remaining portion of the reflector 350 exposed by the hole H.

Figure 9:
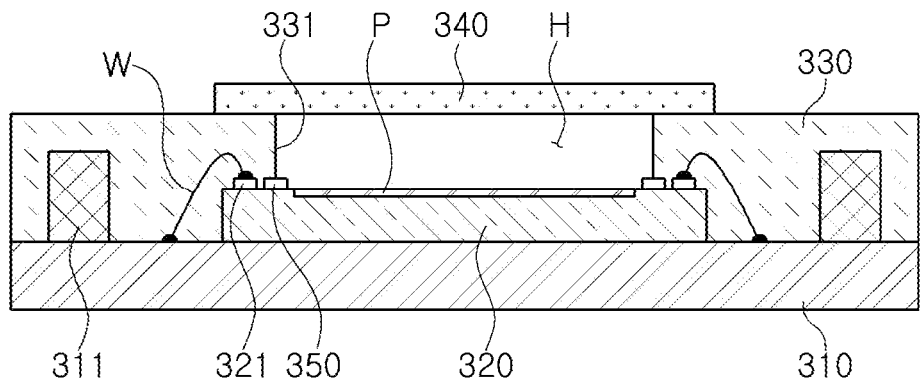

Referring to FIG. 9, a filter 340 is attached to an upper surface of the sealing member 330. As described above, since the filter 340 is attached to the sealing member 330, an additional device or structure for attaching the filter 340 is not required. Thus, a height of the image sensor package 300 itself can be reduced, and accordingly a height of a camera module including the image sensor package 300 can be reduced.

Figure 10:
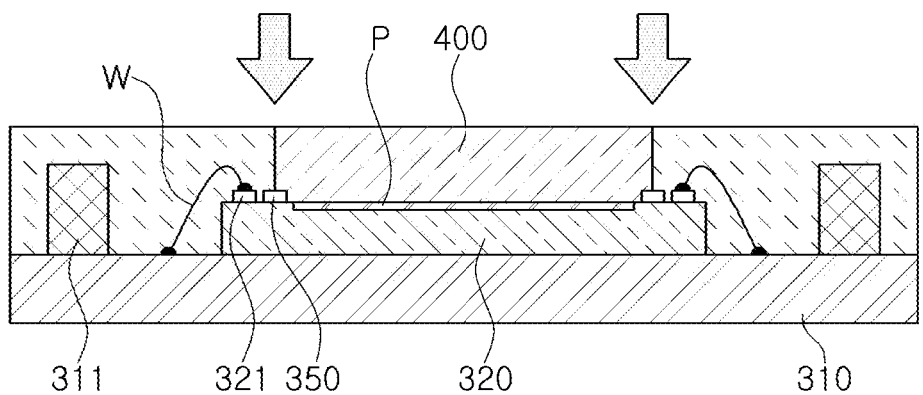
FIG. 10 is a schematic cross-sectional view illustrating an example of a process of removing a protective member during a process of manufacturing an image sensor package.
Figure 11:
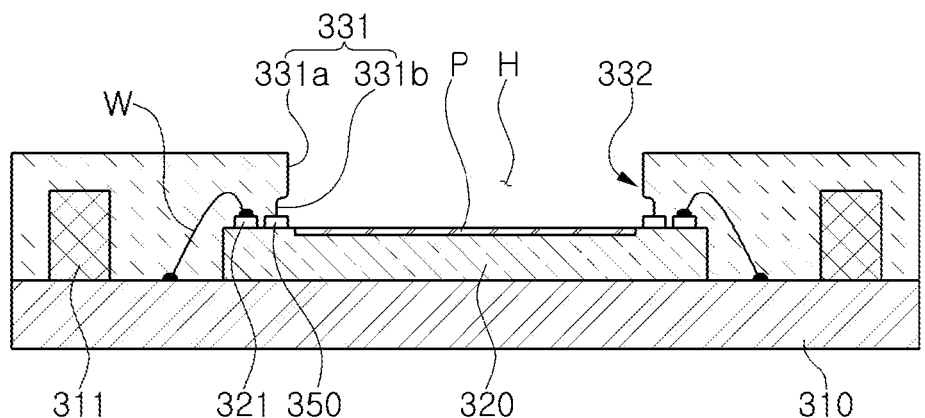
FIG. 11 is a schematic cross-sectional view illustrating an example in which a protective member has been removed from an image sensor package.

FIG. 10 is a schematic cross-sectional view illustrating an example of a process of removing a protective member during a process of manufacturing an image sensor package, and FIG. 11 is a schematic cross-sectional view illustrating an example in which a protective member has been removed from an image sensor package.

Referring to FIG. 10, a laser is irradiated on a boundary between the sealing member 330 and the protective member 400 as indicated by the arrows in FIG. 10. Accordingly, the protective member 400 is separated from the sealing member 330.

The reflector 350 is disposed on the image sensor 320 at a boundary between the sealing member 330 and the protective member 400. As an example, a portion of the reflector 350 is covered by the sealing member 330, and a remaining portion of the reflector 350 is covered by the protective member 400.

Since the reflector 350 is disposed on the image sensor 320 at the boundary between the sealing member 330 and the protective member 400, the reflector 350 prevents the image sensor 320 from being damaged by the laser when the laser is irradiated on the boundary to separate the protective member 400 from the sealing member 320.

Referring to FIG. 11, furthermore, when the laser is irradiated on the boundary between the sealing member 330 and the protective member 400, a portion of the sealing member 330 is removed by laser light reflected by the reflector 350.

As an example, a stepped portion 332 is formed on the inner side surface 331 of the sealing member 330. The inner side surface 331 of the sealing member 330 is a surface forming the hole H of the sealing member 330. The stepped portion 332 is formed adjacent to the reflector 350.

The inner side surface 331 of the sealing member 330 includes a first surface 331a extending from an upper surface of the sealing member 330 toward the reflector 350, and a second surface 331b extending from the first surface 331a to the reflector 350.

The first surface 331a is a surface protruding further toward a center of the hole H than the second surface 331b, and the stepped portion 332 is formed between the first surface 331a and the second surface 331b. As an example, an inner side surface 331 of the sealing member 330 forming the hole H of the sealing member 330 has a recessed shape at a position adjacent to the reflector 350.

The stepped portion 332 formed in the inner side surface 331 of the sealing member 330 causes a size of a portion of the hole H of the sealing member 330 adjacent to the image sensor 320 to be larger than a size of a portion of the hole H adjacent to the filter 340 when the hole H is viewed in a direction perpendicular to an upper surface of the image sensor.

The inner side surface 331 of the sealing member 330 may be rougher than the upper surface of the sealing member 330. Accordingly, if light is reflected by the inner side surface 331 of the sealing member 330, the reflected light is scattered, thereby preventing a flare phenomenon from occurring.

A portion of the light passing through the lens portion 100 may be incident on the inner side surface 331 of the sealing member 330 and be reflected by the inner side surface 331 before the light is received by the image sensor 320. That is, even when the sealing member 330 is made of a material with a low reflectance, a portion of the light passing through the lens portion 100 may be reflected by the inner side surface 331. When the reflected light is received by the image sensor 320, a flare phenomenon occurs.

However, in the example of the image sensor package 300 illustrated in FIG. 2, the inner side surface 331 of the sealing member 330 may be made rough to scatter the reflected light so that the reflected light is not concentrated at one point. Thus, the occurrence of a flare phenomenon may be suppressed.

Figure 12:
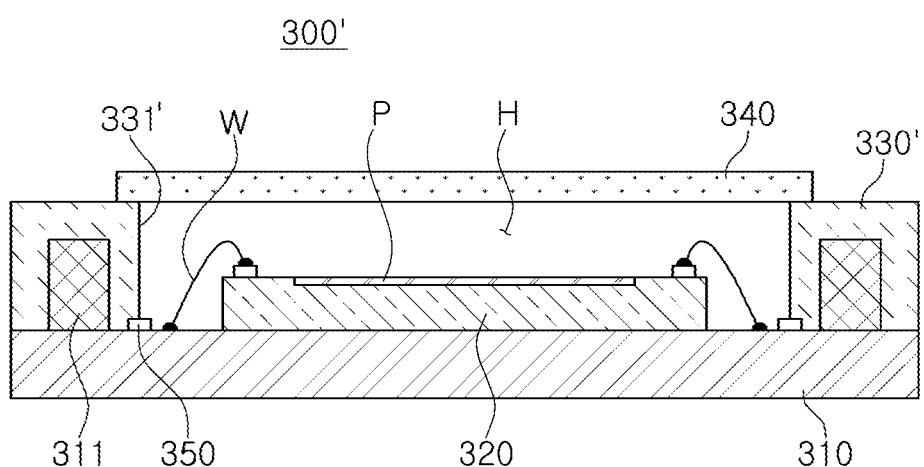
FIG. 12 is a schematic cross-sectional view of another example of an image sensor package.

FIG. 12 is a schematic cross-sectional view of another example of an image sensor package.

Referring to FIG. 12, an image sensor package 300' of FIG. 12 is the same as the image sensor package 300 of FIG. 2 except for a position of the reflector 350 and a shape of the sealing member 330', so that most of the description of the image sensor package 300', except for a description of the position of the reflector 350 and the shape of the sealing member 330', will be omitted.

Referring to FIG. 12, the image sensor package 200' includes a substrate 310, an image sensor 320, a sealing member 330', and a filter 340.

The sealing member 330' is disposed on the substrate 310 to cover and seal the electronic component 311.

The sealing member 330' surrounds a periphery of the bonding wire W, and has a hole H exposing the bonding wire W and the image sensor 320. Although not illustrated in FIG. 12, an inner side surface 331' of the sealing member 330' may have the same shape of the inner surface 331 of the sealing member 330 illustrated in FIG. 11.

The reflector 350 is disposed on the substrate 310 between the electronic component 311 and the bonding wire W, and at least a portion of the reflector 350 is covered by the sealing member 330'.

As an example, a portion of the reflector 350 is covered by the sealing member 330', and a remaining portion of the reflector 350 is exposed by the hole H.

The examples of an image sensor package satisfy a demand for miniaturization of an image sensor package.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An image sensor package comprising:
    a substrate;
    an image sensor mounted on the substrate;
    a bonding wire connecting the image sensor to the substrate;
    a reflector disposed on the image sensor and configured to reflect light away from the image sensor;
    a sealing member sealing the bonding wire and a portion of the image sensor, and covering at least a portion of the reflector, the sealing member comprising a hole exposing an effective imaging plane of the image sensor; and
    a filter attached to the sealing member,
    wherein at least a portion of an upper surface of the reflector is exposed by the hole of the sealing member, and
    the sealing member comprises an inner side surface extending from the upper surface of the reflector and forming the hole that exposes the effective imaging plane of the image sensor and at least the portion of the upper surface of the reflector.

2. The image sensor package of claim 1, wherein the reflector is disposed outside the effective imaging plane.

3. The image sensor package of claim 1, wherein a portion of the reflector is covered by the sealing member, and a remaining portion of the reflector is exposed by the hole of the sealing member.

4. The image sensor package of claim 1, wherein the sealing member further comprises an upper surface to which the filter is attached,
    the inner side surface of the sealing member forming the hole extends between the upper surface of the sealing member and the upper surface of the reflector, and
    the inner side surface of the sealing member is rougher than the upper surface of the sealing member.

5. The image sensor package of claim 1, wherein the sealing member further comprises an upper surface to which the filter is attached,
    the inner side surface of the sealing surface forming the hole extends between the upper surface of the sealing member and the upper surface of the reflector, and
    the inner side surface of the sealing member comprises a stepped portion.

6. The image sensor package of claim 5, wherein the stepped portion causes a width of the hole at the upper surface of the reflector to be larger than a width of the hole at the filter when the hole is viewed in a direction perpendicular to an upper surface of the image sensor.

7. The image sensor package of claim 5, wherein the inner side surface of the sealing member comprises a first vertical surface extending from the upper surface of the sealing member to the stepped portion, and a second vertical surface extending from the stepped portion to the upper surface of the reflector, and
    the first vertical surface protrudes further toward a center of the hole than the second vertical surface.

8. The image sensor package of claim 1, wherein the sealing member further comprises an upper surface to which the filter is attached,
    the inner side surface of the sealing member forming the hole extends between the upper surface of the sealing member and the upper surface of the reflector, and
    a portion of the inner side surface of the sealing member adjacent to the upper surface of the reflector has a recessed shape.

9. The image sensor package of claim 1, wherein the upper surface of the reflector comprises a horizontal upper surface, and
    the sealing member covers at least a portion of the horizontal upper surface of the reflector.

10. The image sensor package of claim 1, wherein the upper surface of the reflector comprises a horizontal upper surface, and
    at least a portion of the inner side surface of the sealing member forming the hole is perpendicular to the upper horizontal surface of the reflector.

11. An image sensor package comprising:
    a substrate;
    an electronic component mounted on the substrate;
    an image sensor mounted on the substrate;
    a bonding wire connecting the image sensor to the substrate;
    a reflector disposed on the substrate and configured to reflect light away from the image sensor;
    a sealing member sealing the electronic component, and covering at least a portion of the reflector, the sealing member comprising a hole exposing the image sensor; and
    a filter attached to the sealing member,
    wherein at least a portion of an upper surface of the reflector is exposed by the hole of the sealing member, and
    the sealing member comprises an inner side surface extending from the upper surface of the reflector and forming the hole that exposes the image sensor and at least the portion of the upper surface of the reflector.

12. The image sensor package of claim 11, wherein the sealing member further comprises an upper surface to which the filter is attached,
    the inner side surface of the sealing member forming the hole extends between the upper surface of the sealing member and the upper surface of the reflector, and
    the inner side surface of the sealing member is rougher than the upper surface of the sealing member.

13. The image sensor package of claim 11, wherein the sealing member further comprises an upper surface to which the filter is attached,
    the inner side surface of the sealing member forming the hole extends between the upper surface of the sealing member and the upper surface of the reflector,
    the inner side surface of the sealing member comprises a stepped portion.

14. The image sensor package of claim 11, wherein the sealing member further comprises an upper surface to which the filter is attached, the inner side surface of the sealing member forming the hole extends between the upper surface of the sealing member and the upper surface of the reflector, and a portion of the inner side surface of the sealing member adjacent to the upper surface of the reflector has a recessed shape.

15. The image sensor package of claim 11, wherein the hole further exposes the bonding wire.

16. An image sensor package comprising:
a substrate;
an electronic component mounted on the substrate;
an image sensor mounted on the substrate;
a bonding wire connecting the image sensor to the substrate;
a reflector disposed on the image sensor or the substrate and configured to reflect light away from the image sensor or the substrate;
a sealing member sealing the electronic component and covering only a portion of the reflector, the sealing member comprising a hole exposing an effective imaging plane of the image sensor and a portion of the reflector that is not covered by the sealing member; and
a filter attached to the sealing member and covering the hole in the sealing member,
wherein the portion of the reflector that is not covered by the sealing member and is exposed by the hole comprises at least a portion of an upper surface of the reflector, and
the sealing member comprises an inner side surface extending from the upper surface of the reflector and forming the hole that exposes the effective imaging plane of the image sensor and the portion of the reflector that is not covered by the sealing member.

17. The image sensor package of claim 16, wherein the image sensor comprises a bonding pad to which the bonding wire is connected,
the reflector is disposed on the image sensor between the bonding pad and the effective imaging plane and is configured to reflect the light away from the image sensor, and the sealing member further seals the bonding pad, the bonding wire, and a portion of the image sensor.

18. The image sensor package of claim 17, wherein the sealing member further comprises an upper surface to which the filter is attached,
the inner side surface of the sealing member forming the hole extends between the upper surface of the sealing member and the upper surface of the reflector, and
the inner side surface of the sealing member comprises a stepped portion causing a width of the hole at the upper surface of the reflector to be larger than a width of the hole at the filter when the hole is viewed in a direction perpendicular to an upper surface of the image sensor.

19. The image sensor package of claim 17, wherein the electronic component is disposed between the bonding wire and an outer edge of the substrate.

20. The image sensor package of claim 16, wherein the reflector is disposed on the substrate between the electronic component and the bonding wire and is configured to reflect the light away from the substrate, and
the hole further exposes the bonding wire.

21. The image sensor package of claim 20, wherein the sealing member further comprises an upper surface to which the filter is attached,
the inner side surface of the sealing member forming the hole extends between the upper surface of the sealing member and the upper surface of the reflector, and
the inner side surface of the sealing member comprises a stepped portion causing a width of the hole at the upper surface of the reflector to be larger than a width of the hole at the filter when the hole is viewed in a direction perpendicular to an upper surface of the image sensor.

22. The image sensor package of claim 20, wherein the electronic component is disposed between the reflector and an outer edge of the substrate.

* * * * *